(12) United States Patent
Sutskover

(10) Patent No.: US 8,621,312 B2
(45) Date of Patent: Dec. 31, 2013

(54) TRANSCEIVER THAT SERVES LDPC CODEWORDS FOR DECODING INCLUDING CLOCK CYCLE BUDGETING BASED ON BLOCK TRANSMISSION LENGTH

(75) Inventor: Ilan Sutskover, Hadera (IL)

(73) Assignee: Intel Corporation, Santa Clara, CA (US)

( * ) Notice: Subject to any disclaimer, the term of this patent is extended or adjusted under 35 U.S.C. 154(b) by 1027 days.

(21) Appl. No.: 12/459,263

(22) Filed: Jun. 26, 2009

(65) Prior Publication Data

US 2010/0332938 A1 Dec. 30, 2010

Related U.S. Application Data

(60) Provisional application No. 61/145,372, filed on Jan. 16, 2009.

(51) Int. Cl.
*H03M 13/00* (2006.01)
*H03M 13/13* (2006.01)

(52) U.S. Cl.
USPC ............................ 714/752; 714/760; 714/774

(58) Field of Classification Search
USPC .......... 714/752, 758, 760, 774; 718/104, 105, 718/106
See application file for complete search history.

(56) References Cited

U.S. PATENT DOCUMENTS

| | | | | |
|---|---|---|---|---|
| 6,772,388 B2 * | 8/2004 | Cooper et al. | ................ | 714/774 |
| 7,266,750 B1 * | 9/2007 | Patapoutian et al. | ......... | 714/758 |
| 7,577,891 B2 * | 8/2009 | Farjadrad et al. | ............. | 714/752 |
| 7,685,500 B2 * | 3/2010 | Jacobsen et al. | .............. | 714/774 |
| 7,805,642 B1 * | 9/2010 | Farjadrad | ...................... | 714/708 |
| 8,190,962 B1 * | 5/2012 | Chen et al. | ..................... | 714/752 |
| 8,245,104 B2 * | 8/2012 | Yang et al. | ..................... | 714/758 |
| 2006/0190799 A1 * | 8/2006 | Kan et al. | ...................... | 714/758 |
| 2009/0273492 A1 * | 11/2009 | Yang et al. | ...................... | 341/81 |
| 2010/0332939 A1 * | 12/2010 | Shimanuki | .................... | 714/752 |

OTHER PUBLICATIONS

"Receiving Apparatus and Iterative Decoding Method" by Motozuka Hiroyuki JP Publication 2007-006382 published Jan. 11, 2007 JP Application No. 2005-186999.*

* cited by examiner

*Primary Examiner* — Joseph Schell
(74) *Attorney, Agent, or Firm* — Ellis B. Ramirez; PRASS LLP

(57) ABSTRACT

An embodiment of the present invention provides an apparatus, including a transceiver operable for communication using LDPC codes for error correction, the transceiver adapted to use an LDPC decoder that acts as a server to serve all LDPC codewords contained in at least one block transmission, and wherein the LDPC decoder consumes a certain number of clock cycles per decoding of a single codeword and a length of the block dictates a clock cycles budget that the server can use.

20 Claims, 2 Drawing Sheets

TRANSCEIVER THAT SERVES LDPC CODEWORDS FOR DECODING INCLUDING CLOCK CYCLE BUDGETING BASED ON BLOCK TRANSMISSION LENGTH

CROSS-REFERENCE TO RELATED APPLICATIONS

The present application claims the benefit of U.S. provisional application Ser. No. 61/145,372, filed Jan. 16, 2009, entitled "LDPC DECODING OF HIGH CONSTELLATIONS" the entire content of which is incorporated by reference herein.

BACKGROUND

Low Density Parity Check (LDPC) codes are used for error correcting in noisy channels. Although not limited in this respect and not limited to wireless communications, to exemplify, LDPC codes appear in various standards, such as the Institute for Electrical and Electronic Engineers (IEEE) 802.16e, IEEE 802.11n, DVB-T2 and IEEE 802.15.3c, for example.

An iterative LDPC decoder is conventionally used. This decoder is controlled in part by the maximum allowed number of iterations per codeword. Performance of such a decoder is monotone with the number of iterations—as a rule of thumb, when the number of iterations decrease, the performance does not increase (e.g., block error rate may not further decrease).

Thus, a strong need exists for improved techniques for LDPC decoding.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
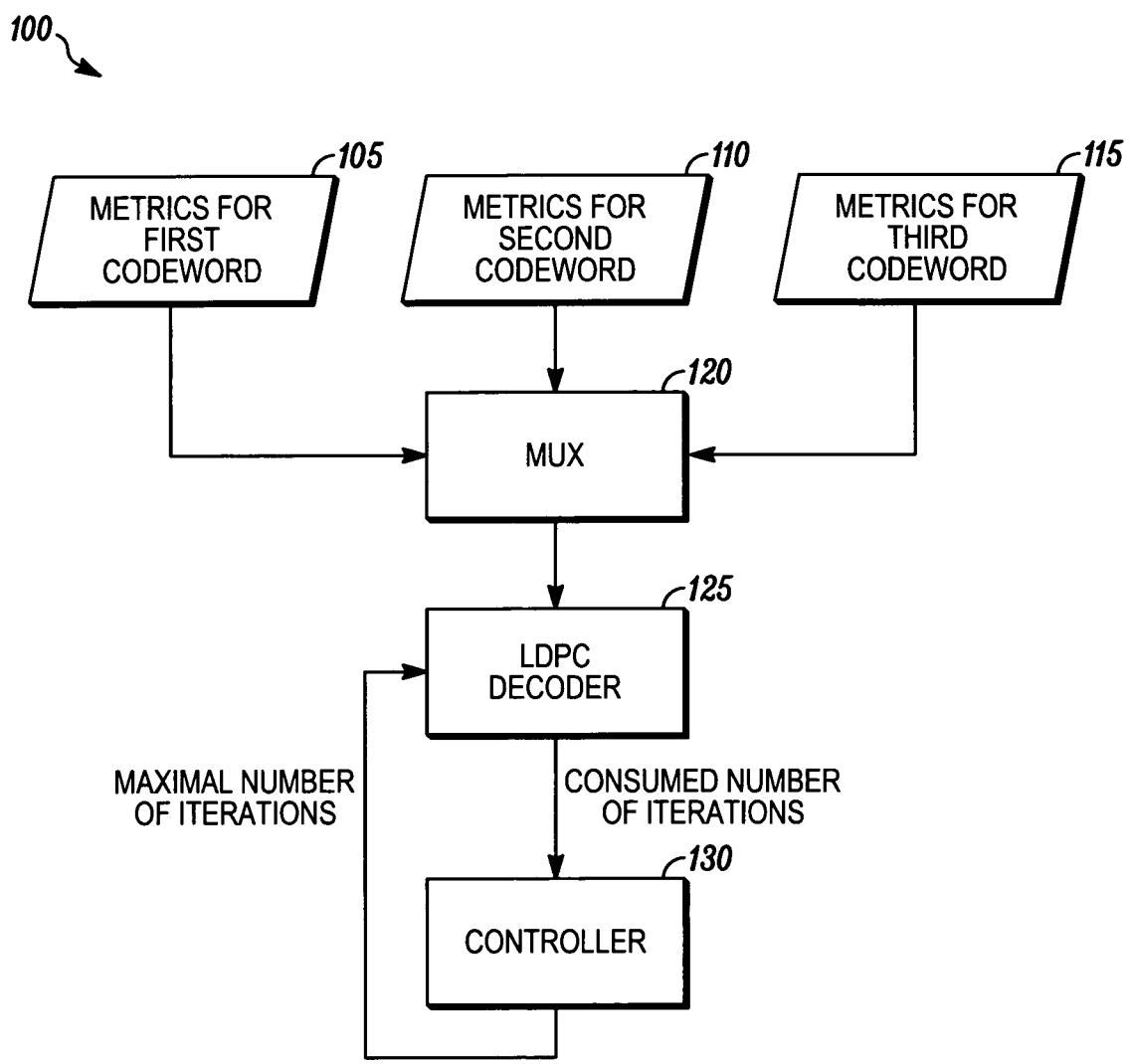
FIG. 1 depicts a possible architecture for decoding up to 64 QAM with a controller to control a number of iterations according to embodiments of the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the preset invention may be practiced without these specific details. In other instances, well-known methods, procedures, components and circuits have not been described in detail so as not to obscure the present invention.

Although embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. For example, "a plurality of stations" may include two or more stations.

As mentioned above, LDPC codes are used for error correcting in noisy channels. An iterative LDPC decoder is conventionally used. This decoder is controlled in part by the maximum allowed number of iterations per codeword. Performance of such a decoder is monotone with the number of iterations—as a rule of thumb, when the number of iterations decrease the performance does not increase (e.g., block error rate may not further decrease). It is noted that the present invention is not limited to any particular type of iterative LDPC decoders—fully parallel belief propagation, layered belief propagation etc.

Although not limited in this respect, embodiments of the present invention address the problem of the number of iterations that a single decoder can perform within a single block time, such as but not limited to, an OFDM symbol time, which is limited. For high order constellations (such as 64 QAM), in several embodiments of the present invention, there are multiple codewords per symbol. Although dependant on a number of parameters, such as the decoding algorithm, LDPC code realization and signal to noise ratio (SNR) working point etc., on average, each codeword may consume only a portion of the total iterations budget until successful decoding; but when exceptionally bad reception conditions occur, more iterations may be required. For example, at the proper SNR working point, the number of iterations required for decoding of a single codeword may be on average one third of the total number of iterations available.

Embodiments of the present invention provide methods and apparatus to enable the existing limited amount of iterations to still support excellent decoding of multiple codewords, allowing more iterations when conditions are tough.

In situations where more than one LDPC codeword requires decoding over a single block, such as OFDM symbol, embodiments of the present invention provide treating the LDPC decoder as a server. This server will serve all LDPC codewords contained in a single (or more) block. The LDPC decoder consumes a certain number of clock cycles per iteration. The length of the block dictates the clock cycles budget that the server (decoder) can use. For example, in WGA, an OFDM symbol can be as short as 223 ns and under a 160 MHz clock (clock duty cycle of 6.25 ns) resulting in a budget of floor (223/6.25)=35 clock cycles. Assuming an iteration is finished in 3 clock cycles, then an OFDM symbol has a budget of 11 iterations. Another example is having a 200 MHz clock (duty cycle of 5 ns) and a budget of floor (223/5)=44 clock cycles, which is enough for 11 iterations if 4 clocks are required per iteration.

Embodiments of the present invention provide not only using the LDPC decoder as a server, but also to limit the maximum number of iterations it is allowed per codeword. Moreover, embodiments of the present invention may start the first codeword (in a certain symbol) with the entire "budget of iterations" which is equal to the maximum number of iterations per symbol (e.g., 10).

Embodiments of the present invention provide the server has an ability to inform upon early completion and to report the number of iterations consumed. Further, the maximum number of iterations per "job" may be updated by a module controlling the server, at the end of any decoding operation. This number may be initialized every block time, such as OFDM symbol, up to a maximum. Also, the present invention may be applied to LDPC decoding—particularly when a transmitted block contains an integer number of LDPC codewords. For example, if the total budget of iterations may equal 11 and there are three codeword per block transmission that requires decoding, the controller may set the maximum number of iterations to 11 for decoding of first codeword in the block and the decoder may complete decoding within 3 iterations in which case the controller may instruct the decoder to decode second codeword within no more than 8 iterations. In this example, if the decoder finishes within 6 iterations decoding of second codeword, the controller may instruct the decoder to decode the third and last codeword while limited to two iterations only, in order to conform to the total budget of iterations.

Further, embodiments of the present invention provide the allowance of a predetermined amount jitter in the budget maximal value. For example, the present invention may allow exceptions where the budget increases by a few iterations at the expense of the budget of the next few symbols.

Embodiments of the present invention further provide a situation where two servers are available (i.e., two LDPC decoders) and a number between one and three LDPC codewords needs to be processed by these two servers. It is noted that the present invention is not limited to one to three codewords. In one embodiment, for example, when the first two decoders decode two codewords, then one of them starts decoding a third codeword (in the case of 64 QAM). By the end of the symbol time, the idle decoder will start a new codeword, but the occupied decoder (if indeed it is occupied) will first finish the third codeword of previous OFDM symbol before it starts processing the second codeword of the current OFDM symbol. Thus, embodiments of the present invention provide that the present invention is not limited by the number of servers and number of LDPC codewords (as long as the number of codewords may sometimes be greater than the number of servers). It is further understood that embodiments of the present invention are not limited to the method of dictating the maximum number of iterations per codeword.

Turning now to the figures, FIG. 1 at 100 depicts a possible architecture for decoding up to 64 QAM, where 64 QAM modulation implies three codeword per block, of an embodiment of the present invention. It may include metrics for first codeword 105 and metrics for second codeword 110 and metrics for third codeword 115 feeding MUX 120 and output to LDPC decoder 125. A controller 130 may be provided to control a number of iterations in embodiments of the present invention. It is understood that the controlling module may not part of the server. For example, if two servers are used, the control may still be one unit.

Figure 2:
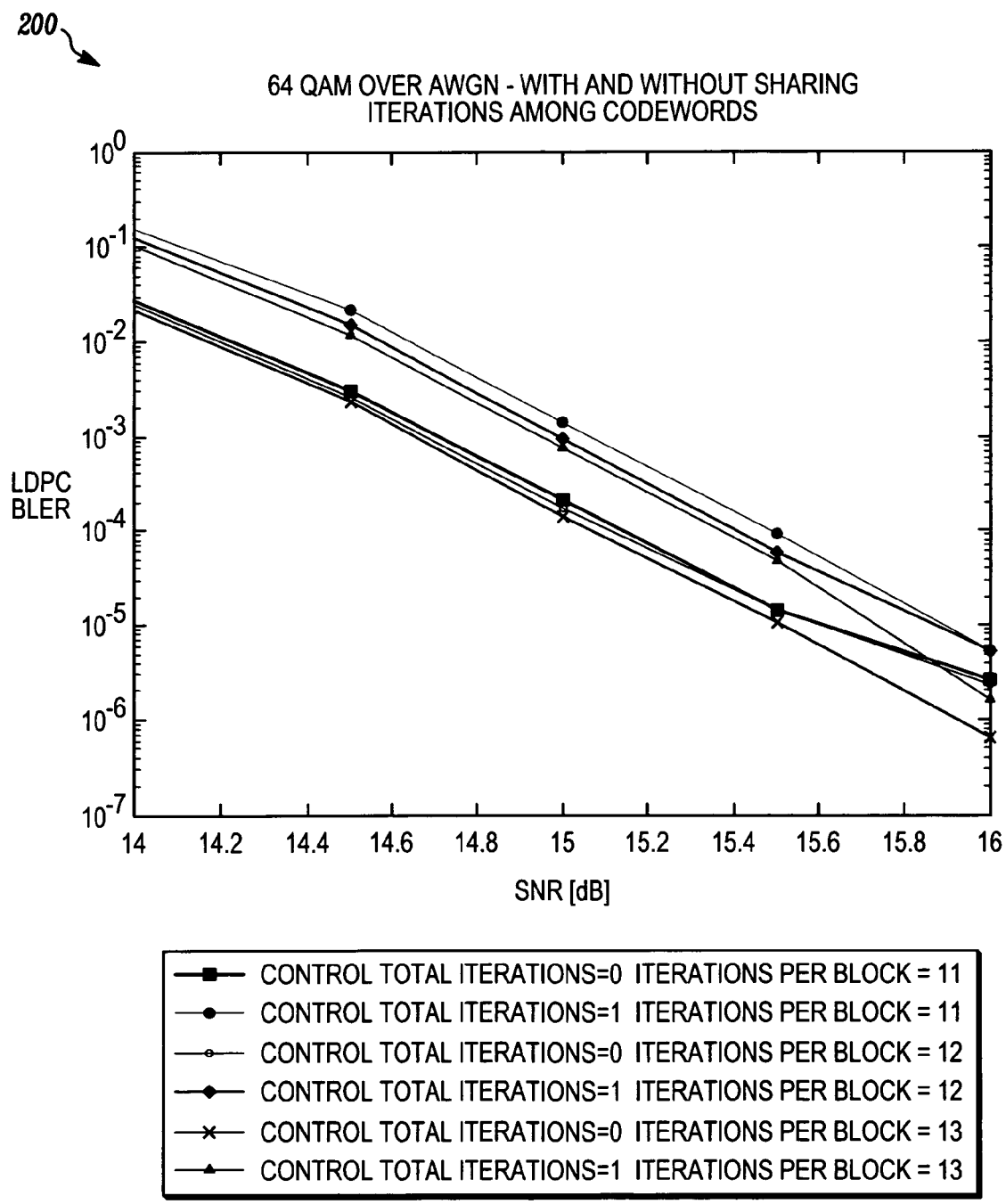
FIG. 2 depicts a graph of the performance of 64 QAM over AWGN with the number of iterations limited to 11, 12 or 13 according to embodiments of the present invention.

Looking now at FIG. 2, shown generally as 200, is the performance of 64 QAM over AWGN with the number of iterations limited to 11, 12 or 13. A flag (denoted in the figure as ControlTotalIterations) may be set such that the number of iterations is shared by the three codewords in the apparatus and methods described above. One can see that with a limit of eleven iterations, the loss is between 0.4 dB for high block error rate (BLER) and vanishes for low BLER (0.2 dB for 5e−6 BLER). This performance loss is almost marginal.

An embodiment of the present invention further provides a computer readable medium encoded with computer executable instructions, which when accessed, cause a machine to perform operations comprising using LDPC codes for error correction in a transceiver adapting the transceiver to use an LDPC decoder that acts as a server to serve all LDPC codewords contained in at least one block transmission and wherein the LDPC decoder consumes a certain number of iterations per decoding of a single codeword and a length of the block dictates an iteration budget that the server can use. It is understood that the present invention is valid both for controlling clock cycles and for controlling iterations as provided in this embodiment.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

I claim:

1. An apparatus, comprising:
   a transceiver operable for communication using LDPC codes for error correction, said transceiver adapted to use an LDPC decoder that acts as a server to serve all LDPC codewords contained in at least one block transmission; and
   wherein said LDPC decoder consumes a certain number of clock cycles per decoding of a single codeword and a length of said at least one block transmission dictates a clock cycles budget that said LDPC decoder can use.

2. The apparatus of claim 1, wherein said LDPC decoder also is limited to a maximum number of iterations it is allowed to utilize per codeword.

3. The apparatus of claim 2, wherein a first codeword starts with an entire allocation of iterations equal to a maximum number of iterations per symbol.

4. The apparatus of claim 2, wherein said server is capable of informing upon early completion of decoding of a single codeword and reporting a number of iterations consumed, and a maximum number of iterations is updated by a module controlling said server at an end of any decoding operation.

5. The apparatus of claim 4, wherein said number is initialized every block time to a predetermined maximum.

6. The apparatus of claim 1, wherein decoding of a block contents can prolong beyond block time.

7. The apparatus of claim 1, wherein said server is two servers and a number between and including 1 to 3 of LDPC codewords has to be processed by said two servers.

8. A method, comprising:
   using LDPC codes for error correction in a transceiver and adapting said transceiver to use an LDPC decoder that acts as a server to serve all LDPC codewords contained in at least one block transmission; and
   wherein said LDPC decoder consumes a certain number of clock cycles per decoding of a single codeword and a length of said least one block transmission dictates a clock cycles budget that said LDPC decoder can use.

9. The method of claim 8, further comprising limiting said LDPC decoder to a maximum number of iterations it is allowed to utilize per codeword.

10. The method of claim 9, further comprising starting a first codeword with an entire allocation of iterations equal to a maximum number of iterations per symbol.

11. The method of claim 9, further comprising informing by said server upon early completion and reporting a number of iterations consumed and updating a maximum number of iterations by a module controlling said server at an end of any decoding operation.

12. The method of claim 11, further comprising initializing said number every block time to a predetermined maximum.

13. The method of claim 8, further comprising allowing some jitter in a budget maximal value.

14. The method of claim 8, wherein said server is two servers which are available and a number between 1 to 3 of LDPC codewords has to be processed by said two servers.

15. A non-transitory computer readable medium encoded with computer executable instructions, which when accessed, cause a machine to perform operations comprising:
   using LDPC codes for error correction in a transceiver;
      wherein said transceiver is adapted to use an LDPC decoder that acts as a server to serve all LDPC codewords contained in at least one block transmission; and
      wherein said LDPC decoder consumes a certain number of iterations per decoding of a single codeword and a length of said least one block transmission dictates an iteration budget that said LDPC decoder can use.

16. The non-transitory computer readable medium encoded with computer executable instructions of claim 15, further comprising additional instructions that provide limiting said LDPC decoder to a maximum number of iterations it is allowed to utilize per codeword.

17. The non-transitory computer readable medium encoded with computer executable instructions of claim 16, further comprising additional instructions that provide starting a first codeword with an entire allocation of iterations equal to a maximum number of iterations per symbol.

18. The non-transitory computer readable medium encoded with computer executable instructions of claim 15, further comprising additional instructions that provide informing by said server upon early completion and reporting a number of iterations consumed and updating a maximum number of iterations by a module controlling said server at an end of any decoding operation.

19. The non-transitory computer readable medium encoded with computer executable instructions of claim 18, further comprising additional instructions that provide initializing said number every block time to a predetermined maximum.

20. The non-transitory computer readable medium encoded with computer executable instructions of claim 15, wherein said at least one server is two servers and a number between and including 1 to 3 of LDPC codewords has to be processed by said two servers.

\* \* \* \* \*